US011181818B2

(12) United States Patent
Gallagher et al.

(10) Patent No.: US 11,181,818 B2
(45) Date of Patent: Nov. 23, 2021

(54) LITHOGRAPHY SCANNER

(71) Applicants: IMEC VZW, Leuven (BE); Katholieke Universiteit Leuven, KU LEUVEN R&D, Leuven (BE)

(72) Inventors: Emily Gallagher, Burlington, VT (US); Joern-Holger Franke, Ukkel (BE); Ivan Pollentier, Langdorp (BE); Marina Timmermans, Bertem (BE); Marina Mariano Juste, Leuven (BE)

(73) Assignees: IMEC VZW, Leuven (BE); KATHOLIEKE UNIVERSITEIT LEUVEN, KU LEUVEN R&D, Leuven (BE)

( * ) Notice: Subject to any disclaimer, the term of this patent is extended or adjusted under 35 U.S.C. 154(b) by 296 days.

(21) Appl. No.: 16/528,093

(22) Filed: Jul. 31, 2019

(65) Prior Publication Data

US 2020/0209737 A1 Jul. 2, 2020

(30) Foreign Application Priority Data

Dec. 28, 2018 (EP) .................................... 18248203

(51) Int. Cl.
*G03F 1/62* (2012.01)
*G03F 7/20* (2006.01)
(Continued)

(52) U.S. Cl.
CPC ............ *G03F 1/62* (2013.01); *G03F 7/70033* (2013.01); *G03F 7/70091* (2013.01);
(Continued)

(58) Field of Classification Search
None
See application file for complete search history.

(56) References Cited

U.S. PATENT DOCUMENTS 6,522,465 B1 2/2003 Goldstein
7,767,985 B2 * 8/2010 Okoroanyanwu .. G03F 7/70983 250/492.2
(Continued)

FOREIGN PATENT DOCUMENTS

EP 1670043 A2 6/2006
WO 2010/015508 A2 2/2010
(Continued)

OTHER PUBLICATIONS

European Search Report, European Patent Application No. 18248203.4, dated Jul. 11, 2019, 5 pages.
(Continued)

*Primary Examiner* — Michelle M Iacoletti
(74) *Attorney, Agent, or Firm* — McDonnell Boehnen Hulbert & Berghoff LLP

(57) ABSTRACT

The present disclosure relates to a lithography scanner including: a light source configured to emit extreme ultra-violet (EUV) light; a pellicle including an EUV transmissive membrane that is configured to scatter the EUV light into an elliptical scattering pattern having a first major axis; a reticle configured to reflect the scattered EUV light through the pellicle; and an imaging system configured to project a portion of the reflected light that enters an acceptance cone of the imaging system onto a target wafer, wherein a cross section of the acceptance cone has a second major axis, and wherein the pellicle is arranged such that the first major axis is oriented at an angle relative to the second major axis.

19 Claims, 1 Drawing Sheet

(51) Int. Cl.
*G03F 7/00* (2006.01)
*H05G 2/00* (2006.01)
*D01F 9/12* (2006.01)

(52) U.S. Cl.
CPC ............ *G03F 7/70433* (2013.01); *D01F 9/12* (2013.01); *G03F 7/0002* (2013.01); *H05G 2/008* (2013.01)

(56) References Cited

U.S. PATENT DOCUMENTS

| | | | |
|---|---|---|---|
| 2004/0047038 A1 | 3/2004 | Jiang et al. | |
| 2006/0279843 A1 | 12/2006 | Kurt et al. | |
| 2007/0160913 A1 | 7/2007 | Stehle | |
| 2008/0198453 A1 | 8/2008 | Lafontaine et al. | |
| 2015/0301455 A1 | 10/2015 | Schlesener et al. | |
| 2016/0085061 A1* | 3/2016 | Schwab ............... | G02B 5/0891 355/67 |
| 2016/0334698 A1 | 11/2016 | Jeon et al. | |
| 2017/0052456 A1 | 2/2017 | Van Schoot et al. | |
| 2017/0176850 A1 | 6/2017 | Chen et al. | |
| 2017/0205704 A1 | 7/2017 | Nikipelov et al. | |

FOREIGN PATENT DOCUMENTS

| | | |
|---|---|---|
| WO | 2016/116329 A1 | 7/2016 |
| WO | 2018/008594 A1 | 1/2018 |

OTHER PUBLICATIONS

Mochi, Iacopo et al., "Experimental Evaluation of the Impact of EUV Pellicles on Reticle Imaging", Photomask Technology, Proc. of SPIE, vol. 10810, 2018, pp. 1-9.
Timmermans, Marina Y. et al., "CNT EUV Pellicle: Moving Towards a Full-Size Solution", Photomask Technology, Proc. of SPIE, vol. 10451, 2017, pp. 1-15.

* cited by examiner

LITHOGRAPHY SCANNER

CROSS-REFERENCE TO RELATED APPLICATIONS

The present application is a non-provisional patent application claiming priority to European Patent Application No. 18248203.4 filed on Dec. 28, 2018, the contents of which are hereby incorporated by reference.

FIELD OF THE DISCLOSURE

The present disclosure relates to a lithography scanner.

BACKGROUND

In semiconductor fabrication, various photolithographic processes are used in the course of defining devices and circuit patterns. Depending on the size of the features to be defined, different optical lithographic processes may be used. In a photolithographic process, a pattern present on a photomask or reticle may be transferred to a light-sensitive photoresist coating by illuminating the reticle. Typically, light is modulated by the reticle pattern and imaged onto a wafer coated with the light-sensitive photoresist.

In conventional photolithography, a pellicle is commonly placed on the reticle in order to protect the reticle from contamination during handling and exposure. The pellicle will protect the reticle from unwanted particles which otherwise could negatively impact the fidelity of the pattern on the reticle, and therefore the transfer of the pattern to the wafer.

As the patterns become smaller, there is an interest in utilizing shorter wavelengths. In extreme ultraviolet lithography (EUVL) a wavelength of about 13.5 nm is frequently used. The shift to shorter wavelengths has triggered a search for new pellicle designs which provide a high transmissivity to EUV radiation and can withstand the typically harsh conditions in EUVL scanners.

SUMMARY

The present disclosure is based on a realization that typical pellicle designs intended for use in EUVL scanners may cause a non-negligible scattering of light transmitted through the pellicle. If light scattered by the pellicle is collected by an imaging system of the EUVL scanner, this may cause decreased fidelity of the pattern transferred to a target wafer. For example, the light scattered by the pellicle can cause optical issues, such as imaging errors, in the EUVL scanner.

EUVL scanners disclosed herein can perhaps mitigate the issue of pellicle light scattering.

According to a first aspect, an EUVL scanner is provided. The EUVL scanner comprises: an EUV light source; a reticle; a pellicle mounted in front of the reticle and comprising an EUV transmissive membrane which, in use, scatters transmitted light into an elliptical scattering pattern having a major axis; and an anamorphic high-numerical aperture ("high-NA") imaging system configured to project, onto a target wafer, light reflected by the reticle through the pellicle; wherein a cross section of an acceptance cone of the imaging system has a major axis, and wherein the pellicle is arranged relative to the imaging system such that the major axis of the scattering pattern is oriented at an angle relative to the major axis of the cross section of the acceptance cone of the imaging system.

The term "anamorphic high-NA imaging system" can, within the context of this application, be construed as an imaging system which has an acceptance cone that has a non-circular cross section. In other words, in a first direction transverse to an optical axis of the imaging system, such an imaging system has a first numerical aperture, and in a second direction transverse to the optical axis of the imaging system, the imaging system has a second numerical aperture which is different from the first numerical aperture.

The term "acceptance cone" can, within the context of this application, be construed as a cone within which light incident on the imaging system is projected onto the wafer.

By means of the EUVL scanner, an amount of light scattered by the pellicle entering the imaging system may be reduced, thereby reducing optical issues related to light scattered by the pellicle. In other words, by arranging the pellicle relative to the imaging system such that the major axis of the scattering pattern is oriented at an angle relative to the major axis of the cross section of the acceptance cone of the imaging system, the amount of light scattered by the pellicle entering the imaging system may be controlled by controlling the angle.

The transmissive membrane may comprise at least one sheet of carbon nanotube bundles.

A "carbon nanotube bundle" can, within the context of this application, be construed as individual carbon nanotubes aligned along a predominant direction to form bundles. The individual carbon nanotubes may be single-walled carbon nanotubes or multi-walled carbon nanotubes. Such carbon nanotube bundles tend to form spontaneously during manufacture of carbon nanotube films.

A potential advantage of the transmissive membrane comprising at least one sheet of carbon nanotube bundles is that an absorption of EUV light of the transmissive membrane may be decreased in the deep and extreme ultraviolet spectra.

The at least one sheet of carbon nanotube bundles may comprise a plurality of substantially parallel carbon nanotube bundles.

The wording "substantially parallel" can, within the context of this application, be construed as being parallel within ±10%.

A potential advantage of the at least one sheet of carbon nanotube bundles comprising a plurality of substantially parallel carbon nanotube bundles is that the elliptical scattering pattern for light scattered in the pellicle may be more anisotropic.

The major axis of the scattering pattern may be oriented transverse to the major axis of the cross section of the acceptance cone of the imaging system.

A potential advantage of orienting the major axis of the scattering pattern transverse to the major axis of the cross section of the acceptance cone of the imaging system is that it may increase or maximize an amount of light scattered by the pellicle that is not accepted by the imaging system. In other words, it may minimize or decrease an amount of light scattered by the pellicle that is projected to the target wafer. Minimizing or decreasing the amount of light scattered by the pellicle that is projected to the target wafer may reduce flare.

BRIEF DESCRIPTION OF THE FIGURES

The above, as well as additional, features will be better understood through the following illustrative and non-limiting detailed description of example embodiments, with reference to the appended drawings.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1A:
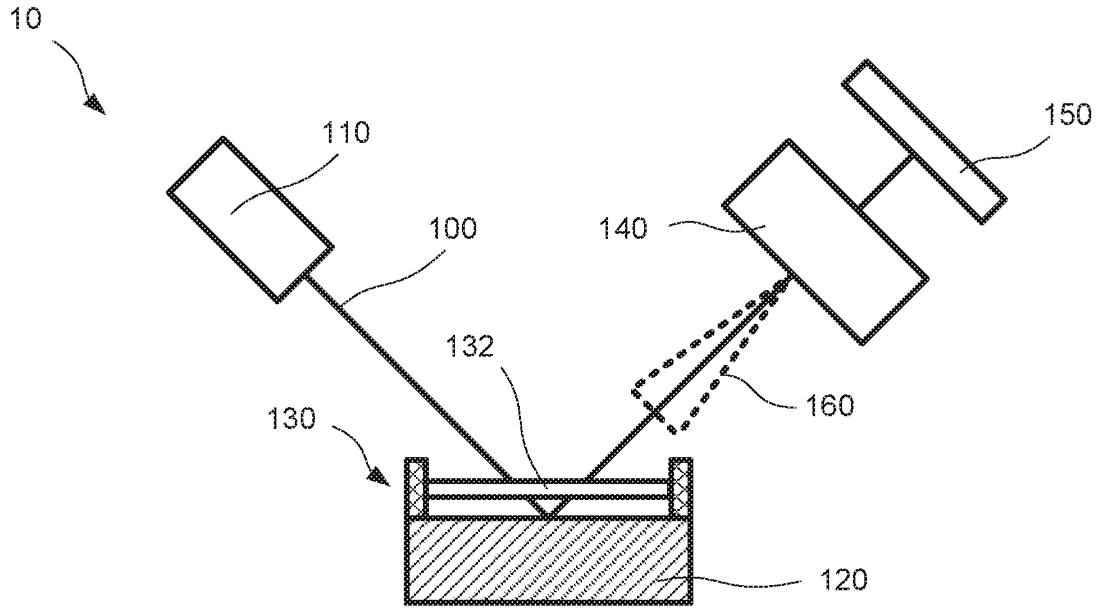
FIG. 1A is a schematic representation of an EUVL scanner comprising a light source, a reticle, a pellicle, and an anamorphic high-NA imaging system, according to an example embodiment.

FIG. 1A is a schematic representation of an EUVL scanner 10. The EUVL scanner 10 comprises an EUV light source 110, a reticle 120, a pellicle 130, and an anamorphic high-NA imaging system 140. The EUVL scanner 10 may have an optical axis 100 as exemplified in FIG. 1A.

The EUV light source 110 may emit light having a wavelength between 5 nm and 40 nm. The EUV light source 110 may comprise a plasma. The EUV light source 110 may comprise optics. The optics may be reflective optics. The optics may comprise collimating optics and/or optics arranged for illuminating the reticle 120. The optics may comprise a pupil mirror. The pupil mirror may define a pupil plane of the scanner. The EUV light source 110 may be arranged for off-axis illumination of the reticle 120. The EUV light source 110 may be arranged for dipole illumination of the reticle 120. The EUV light source 110 may be arranged for quadrupole illumination of the reticle 120. The EUV light source 110 may be arranged for free-form illumination. The arrangement of the EUV light source 110 may be based on the pattern on the reticle 120. For instance, the EUV light source 110 may be arranged for dipole illumination for projecting a line pattern of the reticle 120 on a target wafer 150.

The reticle 120 may comprise a line pattern. The line pattern may have a main direction. The main direction of the line pattern may be a longitudinal direction of the line pattern. The reticle 120 may comprise a rectangular pattern. The reticle 120 may comprise a plurality of rectangular patterns. The reticle 120 may comprise rectangular patterns that define Via or Block layers (e.g. for interconnect layer patterning in the back-end-of-line). In a further example, the reticle 120 may comprise layers of dense rectangles for use in standard cell, logic and memory applications, such as dynamic random-access memory (DRAM).

The pellicle 130 is mounted in front of the reticle 120. The pellicle 130 comprises an EUV transmissive membrane 132. The transmissive membrane 132 may comprise at least one sheet or film of carbon nanotube bundles. The at least one sheet of carbon nanotube bundles may comprise a plurality of substantially parallel carbon nanotube bundles, comprising single-walled and/or multi-walled carbon nanotubes. The plurality of substantially parallel carbon nanotube bundles may be substantially parallel to a surface of the at least one sheet of carbon nanotube bundles. Examples of processes for synthesis of carbon nanotubes include techniques based on arc-discharge methods, laser ablation, and chemical vapor deposition (CVD) methods including floating catalyst (aerosol) CVD synthesis.

The EUV transmissive membrane 132, in use, scatters transmitted light into an elliptical scattering pattern 112 having a major axis 114. The elliptical scattering pattern 112 will be described with reference to FIG. 1B.

The anamorphic high-NA imaging system 140 is configured to project light reflected by the reticle 120 through the pellicle 130 onto the target wafer 150. The anamorphic high-NA imaging system 140 may comprise optics. The optics may be reflective optics.

A cross section 162 of an acceptance cone 160 of the imaging system 140 has a major axis 164. The cross section 162 of the acceptance cone 160 of the imaging system 140 may have a minor axis. The cross section 162 of the acceptance cone 160 may be a transverse cross section of the acceptance cone 160. The major axis 164 of the cross section 162 of the acceptance cone 160 of the imaging system 140 may correspond to a (reticle side) numerical aperture greater than 0.1. A minor axis of the cross section 162 of the acceptance cone 160 of the imaging system 140 may correspond to a (reticle side) numerical aperture less than than 0.1. The numerical aperture corresponding to the major axis 164 of the cross section 162 of the acceptance cone 160 may be larger than the numerical aperture corresponding to the minor axis of the cross section 162 of the acceptance cone 160.

Figure 1B:
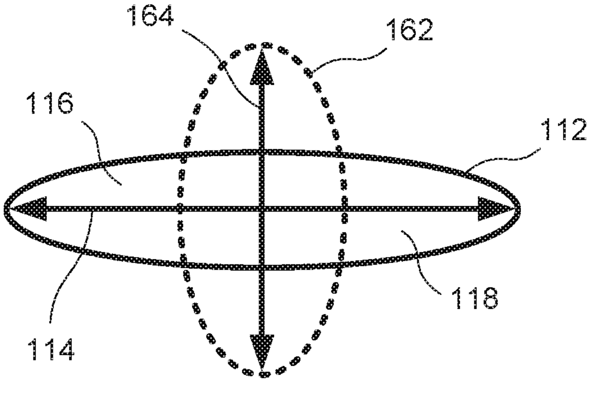
FIG. 1B schematically illustrates, in a pupil plane of the scanner, a cross section of an acceptance cone of the anamorphic high-NA imaging system and scattering patterns of light scattered by the pellicle with the EUV light source arranged for conventional illumination, according to an example embodiment.

FIG. 1B illustrates, in the pupil plane, a cross section 162 of the acceptance cone 160 of the anamorphic high-NA imaging system 140 and an elliptical scattering pattern 112 of light scattered in the pellicle 130. The cross section 162 of the acceptance cone 160 has a major axis 164.

The elliptical scattering pattern 112 may be an intensity distribution of the light in a plane transverse to the optical axis 100. The elliptical scattering pattern 112 has a major axis 114. The major axis 114 may be a largest full width at half maximum of the intensity distribution of light in the plane transverse to the optical axis 100.

As exemplified in FIG. 1B, the EUV light source 110 may be arranged for conventional illumination of the reticle 120. The EUV light source 110 may be arranged for annular illumination of the reticle 120, dipole illumination of the reticle 120, or quadrupole illumination of the reticle 120, or freeform illumination of the reticle 120. It is to be understood that different patterns on the reticle 120 may have different illumination arrangements of the EUV light source 110.

The pellicle 130 is arranged relative to the imaging system 140 such that the major axis 114 of the scattering pattern 112 is oriented at an angle relative to the major axis 164 of the cross section 162 of the acceptance cone 160 of the imaging system 140. The pellicle 130 may be arranged relative to the imaging system 140 such that the major axis 114 of the scattering pattern 112 is oriented transverse to the major axis 164 of the cross section 162 of the acceptance cone 160 of the imaging system 140, as shown in FIG. 1B.

When the major axis 114 of the scattering pattern 112 of light scattered by the pellicle 130 is oriented at an angle relative to the major axis 164 of the cross section 162 of the acceptance cone 160 of the imaging system 140, an amount 116, 118 of light scattered outside the acceptance cone 160 of the imaging system 140 may be controlled by controlling the angle between the major axes 114, 164. The amount 116, 118 of light scattered outside the acceptance cone 160 of the imaging system 140 may be maximized or increased when the major axis 114 of the scattering pattern 112 of light scattered by the pellicle 130 is oriented transverse to the major axis 164 of the cross section 162 of the acceptance cone 160 of the imaging system 140, as shown in FIG. 1B.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A lithography scanner comprising:

a light source configured to emit extreme ultra-violet (EUV) light;

a pellicle comprising an EUV transmissive membrane that is configured to scatter the EUV light into an elliptical scattering pattern having a first major axis;

a reticle configured to reflect the scattered EUV light through the pellicle; and an imaging system configured to project a portion of the reflected light that enters an acceptance cone of the imaging system onto a target wafer, wherein a cross section of the acceptance cone has a second major axis, and wherein the pellicle is arranged such that the first major axis is oriented at an angle relative to the second major axis.

2. The lithography scanner of claim 1, wherein a first numerical aperture corresponding to a minor axis of the acceptance cone is less than a second numerical aperture corresponding to the second major axis.

3. The lithography scanner according to claim 1, wherein the EUV transmissive membrane comprises at least one sheet of carbon nanotube bundles.

4. The lithography scanner according to claim 3, wherein the at least one sheet of carbon nanotube bundles comprises a plurality of substantially parallel carbon nanotube bundles.

5. The lithography scanner according to claim 3, wherein the at least one sheet of carbon nanotube bundles comprises single-walled carbon nanotubes.

6. The lithography scanner according to claim 3, wherein the at least one sheet of carbon nanotube bundles comprises multi-walled carbon nanotubes.

7. The lithography scanner according to claim 3, wherein the at least one sheet of carbon nanotube bundles are substantially parallel to a surface of the at least one sheet of carbon nanotube bundles.

8. The lithography scanner according to claim 1, wherein the first major axis is oriented transverse to the second major axis.

9. The lithography scanner of claim 1, wherein the light source is configured to emit light having a wavelength between 5 nm and 40 nm.

10. The lithography scanner of claim 1, wherein the light source is a plasma light source.

11. The lithography scanner of claim 1, wherein the light source comprises collimating optical components.

12. The lithography scanner of claim 1, wherein the light source comprises a pupil mirror.

13. The lithography scanner of claim 1, wherein the light source is configured for off-axis illumination of the reticle.

14. The lithography scanner of claim 1, wherein the light source is configured for dipole illumination.

15. The lithography scanner of claim 1, wherein the light source is configured for quadrupole illumination.

16. The lithography scanner of claim 1, wherein the light source is configured for free-form illumination.

17. The lithography scanner of claim 1, wherein the reticle comprises a line pattern.

18. The lithography scanner of claim 1, wherein the reticle comprises a rectangular pattern.

19. A method of operating a lithography scanner, the method comprising:

emitting extreme ultra-violet (EUV) light via a light source;

scattering, via a transmissive membrane of a pellicle, the EUV light into an elliptical scattering pattern having a first major axis;

reflecting, via a reticle, the scattered EUV light through the pellicle; and projecting, via an imaging system, a portion of the reflected light that enters an acceptance cone of the imaging system onto a target wafer, wherein a cross section of the acceptance cone has a second major axis, and wherein the pellicle is arranged such that the first major axis is oriented at an angle relative to the second major axis.

* * * * *